United States Patent
Sandberg et al.

(10) Patent No.: US 10,901,884 B2
(45) Date of Patent: Jan. 26, 2021

(54) WEAR LEVELLING IN NON-VOLATILE MEMORIES

(71) Applicant: Arm Limited, Cambridge (GB)

(72) Inventors: Andreas Lars Sandberg, Cambridge (GB); Irenéus Johannes de Jong, Cambridge (GB); Andreas Hansson, Cambridge (GB)

(*) Notice: Subject to any disclaimer, the term of this patent is extended or adjusted under 35 U.S.C. 154(b) by 0 days.

(21) Appl. No.: 15/781,979

(22) PCT Filed: Dec. 2, 2016

(86) PCT No.: PCT/GB2016/053797
§ 371 (c)(1),
(2) Date: Jun. 6, 2018

(87) PCT Pub. No.: WO2017/098218
PCT Pub. Date: Jun. 15, 2017

(65) Prior Publication Data
US 2018/0365142 A1 Dec. 20, 2018

(30) Foreign Application Priority Data

Dec. 10, 2015 (GB) .................................. 1521821.7

(51) Int. Cl.
*G06F 13/00* (2006.01)
*G06F 13/28* (2006.01)
(Continued)

(52) U.S. Cl.
CPC ........ *G06F 12/0246* (2013.01); *G06F 3/0679* (2013.01); *G06F 11/1048* (2013.01);
(Continued)

(58) Field of Classification Search
CPC ............ G06F 11/1048; G06F 12/0246; G06F 2212/7201; G06F 2212/7211; G06F 3/0679; G11C 2029/0409; G11C 29/00
See application file for complete search history.

(56) References Cited

U.S. PATENT DOCUMENTS

2012/0226738 A1 * 9/2012 Taneja .................... H04L 67/34
709/203
2012/0246395 A1 9/2012 Cho et al.
(Continued)

FOREIGN PATENT DOCUMENTS

WO WO2013/048470 4/2013
WO WO 2013/095641 6/2013

OTHER PUBLICATIONS

GB1521821.7, Combined Search and Examination Report, GB Intellectual Property Office, dated Feb. 26, 2016.
(Continued)

*Primary Examiner* — Yong J Choe
(74) *Attorney, Agent, or Firm* — Leveque IP Law, P.C.

(57) ABSTRACT

Broadly speaking, embodiments of the present technique provide an apparatus and methods for improved wear-levelling in non-volatile memory (NVM) devices. In particular, the present wear-levelling techniques operate on small blocks within a memory device, at a finer scale/granularity than that used by common wear-levelling techniques which often remap large blocks (e.g. several kilobytes) of data.

19 Claims, 6 Drawing Sheets

(51) Int. Cl.
*G06F 12/02* (2006.01)
*G11C 29/00* (2006.01)
*G06F 3/06* (2006.01)
*G06F 11/10* (2006.01)
*G11C 29/04* (2006.01)

(52) U.S. Cl.
CPC ...... *G11C 29/00* (2013.01); *G06F 2212/7201* (2013.01); *G06F 2212/7211* (2013.01); *G11C 2029/0409* (2013.01)

(56) References Cited

U.S. PATENT DOCUMENTS

| | | | |
|---|---|---|---|
| 2012/0265928 A1 | 10/2012 | Mun et al. | |
| 2012/0297271 A1* | 11/2012 | Sommer | G06F 11/1048 714/766 |
| 2013/0205139 A1* | 8/2013 | Walrath | G06F 21/72 713/190 |
| 2015/0082449 A1* | 3/2015 | Mushkatblat | G06F 21/6254 726/26 |

OTHER PUBLICATIONS

PCT/GB2016/053797, International Search Report and Written Opinion, EPO, dated Mar. 3, 2017.

\* cited by examiner

WEAR LEVELLING IN NON-VOLATILE MEMORIES

RELATED PATENT APPLICATIONS

This patent application is a 35 U.S.C. 371 National stage U.S. patent application of PCT patent application PCT/GB2016/053797 with an International filing date of Dec. 2, 2016 claiming priority to GB patent application 1521821.7 filed on Dec. 10, 2015, the entire content of which is hereby incorporated by reference.

FIELD OF THE DISCLOSURE

The present techniques generally relate to wear levelling for non-volatile memories, and in particular to wear levelling on small blocks in a non-volatile memory device.

BACKGROUND

Non-volatile memory (NVM) is a class of memory in which the memory cell or element does not lose its state after power supplied to the cell/element is removed. Examples of non-volatile memory devices include flash memory, magnetic computer storage devices (e.g. hard disks, floppy disks, and magnetic tape), and optical discs. Other examples of NVM devices include phase change memory (PCM/PCRAM) devices, resistive random access memory (RRAM/ReRAM) devices, and Correlated Electron Material (CEM/CeRAM) devices. In a phase change memory device, programming (writing) involves heating the memory cell to melt it, (which causes a change in resistance) and cooling to either a conductive crystalline state or a non-conductive amorphous state. In a resistive RAM device, programming involves changing the resistance across a dielectric solid-state material. A CeRAM device is formed (wholly or in part) from a Correlated Electron Material (CEM), which exhibits an abrupt conductive or insulative state transition arising from electron correlations rather than solid state structural phase changes.

Generally speaking, NVM cells or devices can be electrically erased and reprogrammed. However, NVM cells or devices often wear out over time due to repeated erase and reprogram cycles. This wearing can result in higher bit errors and eventually, may result in part of the NVM device being unable to store data. Flash memories typically have an endurance of $10^5$ program/erase cycles, PCMs typically between $10^7$ and $10^9$ program/erase cycles, CeRAM is expected to be on the order of $10^9$ program/erase cycles, while dynamic random access memories (DRAMs) support at least $10^{15}$ program/erase cycles. The wearing has different causes depending on the type of memory device. PCMs typically wear out because of the high temperature used when writing. The high temperature causes the PCM cell to physically expand and contract, which stresses the material in the cell. Flash memories wear out because successive program/erase cycles wear down the metal oxide layer in the bit cell.

The present applicant has recognised the need for improved techniques to increase the lifespan of NVM devices that are subject to a high number of program/erase cycles.

DESCRIPTION OF THE DRAWINGS

The techniques are diagrammatically illustrated, by way of example, in the accompanying drawings, in which.

DETAILED DESCRIPTION

Figure 1:
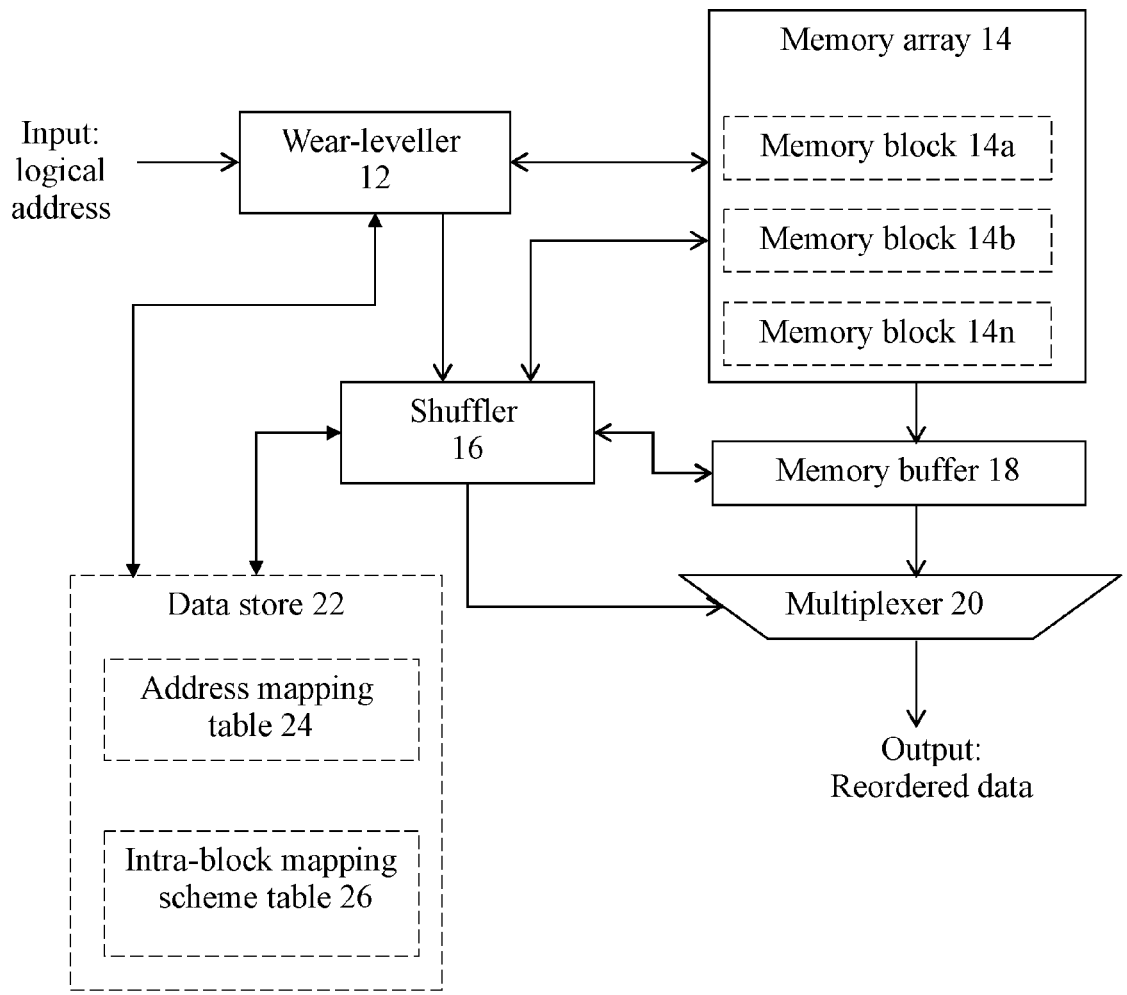
FIG. 1 shows a block diagram of a wear-levelling apparatus.

According to a first aspect of the present technique there is provided a method of wear-levelling a memory array, the method comprising: determining a first physical memory address of a first block of physical memory, the first block of physical memory storing data from a write operation; shuffling write data to be stored within the memory array to provide shuffled data; and writing the shuffled data to the first block of physical memory.

According to a second aspect of the present technique there is provided an apparatus for wear-levelling a memory array, the apparatus comprising: a physical memory array; a first component configured to: determine a first physical memory address of a first block of physical memory, the first block of physical memory storing data from a write operation; a second component configured to: shuffle write data to be stored within the memory array to provide shuffled data; and a third component configured to: write the shuffled data to the first block of physical memory.

As will be appreciated by one skilled in the art, the present techniques may be embodied as a system, method or computer program product. Accordingly, present techniques may take the form of an entirely hardware embodiment, an entirely software embodiment, or an embodiment combining software and hardware aspects.

Furthermore, the present techniques may take the form of a computer program product embodied in a computer readable medium having computer readable program code embodied thereon. The computer readable medium may be a computer readable signal medium or a computer readable storage medium. A computer readable medium may be, for example, but is not limited to, an electronic, magnetic, optical, electromagnetic, infrared, or semiconductor system, apparatus, or device, or any suitable combination of the foregoing.

Computer program code for carrying out operations of the present techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

Broadly speaking, embodiments of the present technique provide apparatus and methods for improved wear-levelling in non-volatile memory (NVM) devices. In particular, the present wear-levelling techniques operate on small blocks within a memory device, at a finer scale/granularity than that used by common wear-levelling techniques which often remap large blocks (e.g. several kilobytes) of data.

The term "non-volatile memory" is used interchangeably herein with the terms "non-volatile memory device", "non-volatile random access memory", "non-volatile memory cell", "non-volatile memory array", "non-volatile memory element", "flash memory", "phase change memory", "resistive random access memory", "Correlated Electron Material memory", or "CeRAM".

The term "program" is used interchangeably herein with the term "write" or "re-write". The term "erase" is used interchangeably herein with the term "delete", or "clear". The term "wear-levelling" is used interchangeably herein with the term "remapping", or "redistributing".

As mentioned above, non-volatile memory devices wear out after a number of program/erase cycles have been performed. Various techniques have been used to increase the lifetime of non-volatile memory devices. For example, active wear-levelling is used to ensure that writes to a memory array are spread uniformly across the whole array, such that particular parts of the memory array are not written to more frequently than other parts. However, such techniques are often limited to wear-levelling on the block level. Furthermore, known wear-levelling techniques require considerable overhead to process the wear-levelling operations. For example, counters are often used per row or block in the memory array to count how many times a particular row/block has been written to, in order to distribute writes across the memory array. Consequently, such techniques often use large quantities of metadata to track the usage of each row/block, which can be expensive. Another technique involves suppressing writes that do not change the state of a bit cell or portion of the memory array, to avoid unnecessarily re-writing the bit cell with information that has not changed. However, this may be costly to implement and/or result in high latency during write cycles. A further technique involves actively detecting for errors within a memory array to ensure that the memory array continues to function correctly even if there are small numbers of faulty bit cells. However, this may be costly to implement as it requires monitoring memory blocks individually.

Embodiments of the present technique provide an improved wear-levelling technique for non-volatile memory devices that support random access (i.e. do not require a separate erase cycle). In particular, the present wear-levelling techniques operate on small blocks within a memory device, and in embodiments at a finer scale/granularity than that used by common wear-levelling techniques which often remap large blocks (e.g. several kilobytes) of data. While remapping large blocks may require less overhead to process wear-levelling operations than if smaller blocks are remapped, performing wear-levelling on large blocks of data may not be an optimum way to increase the lifetime of a memory device. It has been observed that the memory load imbalance takes place at a much smaller (finer) granularity than the large blocks of data used in known wear-levelling methods. For example, in a typical 32-bit data word, it has been observed that the lower 8 bits in the word are typically used (i.e. programmed/erased) more frequently than the higher bits in the word. (These more frequently used bits or bytes may be termed 'hot bits' or 'hot bytes'.) This means that in a 32-bit word, one out of four bytes (i.e. a hot byte) is updated much more frequently than the other three bytes. Consequently, wear-levelling techniques which redistribute (remap) large blocks (kilobytes) of data may not effectively remap the lower 8 bits, such that, within a large block, certain (e.g. lower) bits or bytes are still remapped more often than other (e.g. higher) bits or bytes.

FIG. 1 shows a block diagram of a wear-levelling apparatus 10 according to an embodiment of the present technique. The wear-levelling apparatus 10 comprises a physical memory array 14. The physical memory array is preferably a non-volatile memory array. In embodiments, the physical memory array may comprise flash memory, phase change memory, resistive random access memory, or Correlated Electron Material memory. (Background information on Correlated Electron Material memory is provided below.) A memory array is typically configured to store data in blocks located at equally-spaced addresses. The memory array 14 in FIG. 1 comprises a plurality of memory blocks 14a, 14b, 14n, which are each able to store write data. Each memory block 14a, 14b, 14n is addressed by its physical memory address (PA), such that write data can be written to a particular block in the memory array 14 by sending the write data to the associated physical memory address.

The memory array 14 is coupled to a first component 12 that is configured to receive, as an input, a logical address for data, and translate the logical address (LA) into a physical memory address (PA), in order for data to be read from or written to the memory array 14. The first component 12 in particular embodiments may also function as a wear-leveller to level the wear in the memory array 14. The wear-leveller 12 may be used in both read and write/program operations.

In a write operation (also termed a 'program operation', or a 'program/erase operation', or a 'rewrite operation' herein), the wear-leveller 12 is configured to receive a logical address (LA) for write data which is to be written to the memory array 14. The wear-leveller may determine that data from the received logical address has not been written to the memory array before. In this case, the wear-leveller 12 selects a physical location in the memory array where the write data can be written. Alternatively, the wear-leveller 12 may determine that data from the received logical address is currently stored in the memory array 14. In this case, the wear-leveller 12 may determine the physical location in the memory array 14 that corresponds to the received logical address. That is, the wear-leveller 12 determines a physical memory address (PA) of the memory block that corresponds to the logical address (LA). By way of example, the memory block is memory block 14a, which stores write data (having the same received logical address) from a previous write operation. During a rewrite operation, the data (or some of the data if a partial rewrite operation is taking place) stored in memory block 14a is to be erased and replaced with new (or partially new) write data in the same memory block. However, to prevent memory block 14a from wearing out, the apparatus 10 is configured to shuffle the data when rewriting to a memory block so that frequently used bits/bytes of data ('hot bits'/'hot bytes') may not always located at the same physical position within a memory block. It will be understood that the size of the memory block in memory array 14 may be any size, for example, a few bits, a nibble, a byte, a word, a double-word, a kilobyte, etc.

As explained earlier, the present wear-levelling techniques may operate on small blocks and at a finer scale/granularity than that used by common wear-levelling techniques which often remap large blocks (e.g. several kilobytes) of data. For example, in a typical 32-bit data word, it has been observed that the lower 8 bits in the word may typically be used (i.e. programmed/erased) more frequently than the higher bits in the word. This means that in a 32-bit word, one out of four bytes is updated much more frequently than the other three bytes.

Accordingly, to wear level within memory blocks, the wear-levelling apparatus 10 is configured to shuffle new write data that is to be stored within a memory block prior to it being written to the memory block. That is, new write data is shuffled before it is written to a memory block, so that wear is levelled within a memory block (i.e. intra-block) during write operations. In this way, wear-levelling may be achieved at a finer granularity than common wear-levelling techniques that merely move/remap memory blocks within a memory array.

The apparatus 10 further comprises a second component 16 which is configured to perform the intra-block shuffling to provide the fine-grain wear-levelling. Second component 16 is also termed a 'shuffler', and may be generally configured to shuffle the write data that is to be stored within the memory block (e.g. memory block 14a) to provide shuffled data for storing in the memory block. The shuffling techniques used by shuffler 16 are described in more detail below. In embodiments, the second component/shuffler 16 is configured to shuffle write data that is to be stored within a block of data in the memory array 14, before the shuffled data is stored in the memory block in the memory array 14. In particular embodiments, the shuffler/second component 16 may be configured to shuffle bits or data bytes, or the 'hot bits' or 'hot bytes' of the write data to be stored within the memory block. However, it will be understood that the present techniques may be applied to any size of memory block and any granularity (e.g. bit-level, byte-level, word-level, block level, etc).

The apparatus 10 further comprises a third component (not shown) that is configured to write the shuffled data (that has been output by the shuffler 16) to the memory block of physical memory (e.g. memory block 14a). In embodiments, this function may be performed by the wear-leveller 12, and/or by the shuffler 16, instead of a separate component.

Thus, in an embodiment of the present technique, a method of wear-levelling a memory array 14 comprises determining (using for example, wear-leveller 12), a first physical memory address of a first block of physical memory (e.g. memory block 14a), the first block of physical memory configured to store data from a write operation. New (or partially new) write data is to be written to the first block of physical memory. The method may comprise shuffling (using the shuffler 16), new (or partially new) write data to be stored within the first block to provide shuffled data. The method may comprise writing the shuffled data to the first block of physical memory (e.g. memory row 14a). These methods may be performed by the wear-leveller 12, or by the shuffler 16, or by the above-mentioned third component of apparatus 10.

In embodiments, the shuffler 16 may shuffle the write data to be stored within a memory block by using a configuration function to determine an intra-block shuffling scheme, and applying the determined intra-block shuffling scheme to the write data.

In embodiments, the method of (a shuffler) using a configuration function comprises using the configuration function to determine an intra-block mapping scheme from a plurality of pre-defined intra-block mapping schemes.

In embodiments, the shuffler may determine the intra-block shuffling scheme by inputting a logical address of the write data into the configuration function. Additionally or alternatively, the shuffler may determine the intra-block shuffling scheme by inputting a logical address of the write data and the first physical memory address into the configuration function. Using at least the logical address as an input to the configuration function may mean that the intra-block mapping scheme can be determined without requiring any additional information. The intra-block mapping scheme may be readily redetermined when reading data from the memory array, since only the logical or logical and physical address are required, which is known information and is easily accessed from a data store 22 (as explained below). Further, the amount of information stored in a data store 22 to determine and redetermine the intra-block mapping scheme applied to particular data may not increase, since the address(es) inputted into the configuration function may be already stored in data store 22.

In some embodiments, the configuration function may not depend on the logical address (or the logical address and physical memory address) of the write data, but may be a simple function that selects an intra-block mapping scheme from the plurality of pre-defined intra-block mapping schemes. In order to read data, which requires unshuffling (undoing the shuffling process), an indication of the selected intra-block mapping scheme may be stored. The indication data indicates which of the pre-defined intra-block mapping schemes was applied to particular data having a particular logical address. Accordingly, the indication data may be stored alongside data which maps a logical address to a physical address. To read data from a particular physical address, the apparatus 10 may be configured to look-up the physical address and the corresponding indication data in a data store, table, page table or similar, to determine which intra-block mapping scheme was applied to the data at the physical address.

The apparatus 10 may be pre-configured to use a particular configuration function, e.g. one which is not dependent on the logical/physical address of the write data, one which is dependent on the logical address, or one which is dependent on the logical and physical address of the write data. Accordingly, for one apparatus 10, the wear-leveller 12 and shuffler 16 apply the same configuration function to all data being written to the memory array of the first apparatus, and for a second apparatus 10, a different configuration function may be applied to all data written to the memory array of the second apparatus.

Optionally, the intra-block shuffling techniques may be combined with traditional block remapping techniques. In such embodiments, the write data is not only shuffled, but it is also written to an entirely different memory block in the memory array 14, i.e. to a different physical location in the memory array. Accordingly, the wear-leveller 12 may be further configured to identify a physical memory address of a free block of physical memory in the memory array 14. By way of example, and referring to FIG. 1, the free block of memory is memory block 14b. During the write operation, the new (or partially new) write data will be shuffled and written to the free memory block 14b, and the old data in memory block 14a will be deleted/erased.

In such a combined block remapping and intra-block shuffling technique, the wear-leveller 12 may determine a memory remapping scheme for the first block of physical memory, and may identify a second physical memory address of a second, free block of physical memory (e.g. memory block 14b). The combined technique may further comprise shuffling the data to be stored within the memory array to provide shuffled data; assigning the second physical memory address to the shuffled data; and writing the shuffled data to the second block of physical memory.

In embodiments, the first component/wear-leveller 12 is further configured to assign the (second) free physical memory address to the shuffled data output by the shuffler 16. The wear-leveller 12 may be configured to update an address mapping table 24 to map the logical address to the new free physical memory address where data is being rewritten.

The apparatus 10 may comprise a buffer 18 (also referred to herein as a 'write buffer' or 'block buffer' or "buffer memory"). The write buffer 18 may be used as a temporary holding place for new write data which is to be shuffled before it is written to the physical memory array. In embodiments, the write data is temporarily written to write buffer 18 (by for example, the wear-leveller 12, the shuffler 16, or the above-mentioned third component). The shuffler 16 then operates on the write data stored in the write buffer to provide shuffled data. The shuffled data in the write buffer 18 is then written to the first block of physical memory which is being programmed/erased, or optionally, to a new, second free block in the memory array as identified by the wear-leveller 12. The write process may be performed by the above-mentioned third component (which may be a dedicated component for writing to the memory and buffer 18), the shuffler 16 or the wear-leveller 12. Thus, in embodiments of the apparatus 10 having a write buffer 18, the first component (wear-leveller 12) may be configured to write the write data to be stored within the physical memory to the write buffer, the second component (shuffler 16) may be configured to shuffle the data in the write buffer to provide shuffled data, and the third component (or the first component and/or the second component) may be configured to write the shuffled data from the write buffer to the first or second block of physical memory (depending on whether intra-block shuffling is being combined with block remapping).

The apparatus 10 may further comprise a multiplexer 20 (or MUX). In embodiments, the multiplexer may be coupled to the physical memory array 14 and the shuffler 16 (second component). In embodiments, the multiplexer 20 is used to select a memory block, or bits or bytes, from the memory array 14. Since the multiplexer is able to select bits or bytes of data from the memory array 14, the shuffler 16 may in embodiments be coupled to the multiplexer 20, to enable the shuffler 16 to perform the intra-block or intra-row shuffling at a bit or byte level. In additional or alternative embodiments, the shuffler 16 may be coupled to, or be a part of, the wear-leveller 12. In this case, the intra-block shuffling can be performed by the wear-leveller 12, but at this level in the apparatus architecture, the shuffling may be performable at a byte level only.

In embodiments, the physical memory array 14 may be, or may comprise, a non-volatile memory (NVM) array. Additionally or alternatively, the physical memory array 14 may comprise any one of: flash memory, phase change memory, resistive random access memory, or Correlated Electron Material memory.

The apparatus 10 may optionally comprise a separate data store or storage medium 22 which is configured to store, for example, an address mapping table 24. In an alternative embodiment, the data store 22 may be provided within the wear-leveller 12 or within another element of the apparatus 10. The address mapping table 24 is configured to store maps which translate logical addresses (LAs) to physical memory addresses (PAs). As mentioned above, the wear-leveller 12 is configured to receive as an input, a logical address (LA) indicating the new write data to be written to the memory array 14, or which stored data is to be read (depending on whether a write or read operation is being performed). The wear-leveller 12 may be further configured to look-up the received logical address in the address mapping table 24 to determine the corresponding physical memory address.

Similarly, the wear-leveller 12 may be configured to update the address mapping table 24 when a program/erase operation has occurred that has involved block remapping (in addition to intra-block shuffling). For example, where a combined intra-block shuffling and block remapping technique is used, such that memory block 14a has been erased and new write data is shuffled and written to memory block 14b, the wear-leveller 12 may be configured to update the address mapping table 24 such that the logical address maps to the new physical memory address (i.e. of memory block 14b) instead of the old physical memory address (i.e. of memory block 14a). Thus, in particular embodiments, the apparatus 10 comprises an address mapping table 24, wherein the wear-leveller 12 (first component) is further configured to: receive a logical memory address (LA); look-up the received logical memory address in the address mapping table; and determine the first physical memory address (PA) that corresponds to the logical memory address from the address mapping table.

The data store 22 may be further configured to store an intra-block mapping scheme table 26. (As mentioned above, the data store 22 may be provided within the wear-leveller 12 in alternative embodiments.) The shuffler 16 may shuffle data within a memory block by using a configuration function to determine an intra-block shuffling scheme, and applying the intra-block shuffling scheme to the write data. The intra-block mapping scheme may be determined from a plurality of pre-defined intra-block mapping schemes. In embodiments, a configuration function uses the address (physical and/or logical) of the write data to determine/select an intra-block mapping scheme from the pre-defined intra-block mapping schemes. Accordingly, the intra-block mapping scheme table 26 may store the plurality of pre-defined intra-block mapping schemes. In such embodiments, as explained earlier, an indication of the chosen/determined intra-block mapping scheme may be stored. However, in embodiments where the configuration function is not dependent on the address(es) of the write data, an indication of which intra-block mapping scheme is selected may be stored. In this case, the shuffler 16 may determine the intra-block mapping scheme from a table storing the plurality of pre-defined intra-block mapping schemes, and store data in the table indicating the determined pre-defined intra-block mapping scheme. Alternatively, the indication data may be stored in the address mapping table 24 alongside the logical address of the write data.

In embodiments, the wear-leveller 12 or shuffler 16 may determine the intra-block mapping scheme by using a configuration function to select one of the stored mapping schemes in the intra-block mapping scheme table 26, such that the mapping scheme applied to write data is dynamically determined For example, an intra-block mapping scheme applied to a particular block of data may be dynamically determined using a configuration function that receives the logical address (and in embodiments, the associated physical memory address) of write data as an input, outputs an intra-block mapping scheme for application to the write data, and applies the intra-block mapping scheme to the write data to provide shuffled data. The configuration function may be a hash function of the logical address, or the logical address and physical address.

As mentioned above, the apparatus 10 may be used for both read and write operations. In a read operation, the wear-leveller 12 is configured to receive a logical address for data stored in a memory block (or part of a memory block), and determine the physical address in the memory array 14 that corresponds to the received logical address, in a similar manner to that described above. Once the physical address has been determined, the wear-leveller 12 provides the physical address to the shuffler 16. In a read operation, the shuffler acts to unshuffle (or order the data, i.e. the inverse of shuffling) the data located at the determined physical address. For example, the shuffled data that had previously been stored in memory block 14a or 14b has to be unshuffled (ordered) to enable it to be understood by a component/processor which is attempting to read the data. The shuffler 16 determines which intra-block mapping scheme was applied to the data located at the received physical address by, for example, consulting the indication data located in the data store 22 or by inputting the physical and/or logical address of the data into the configuration function. (As mentioned above, the indication data may be provided within the address mapping table 24 in alternative embodiments, such that the shuffler 16 consults the address mapping table 24 instead). Once the intra-block mapping scheme has been redetermined, the shuffler 16 applies the inverse of the intra-block mapping scheme to the data (i.e. reverses the shuffling to reorder the data) located at the determined physical address to obtain unshuffled (ordered) data.

Figure 2:
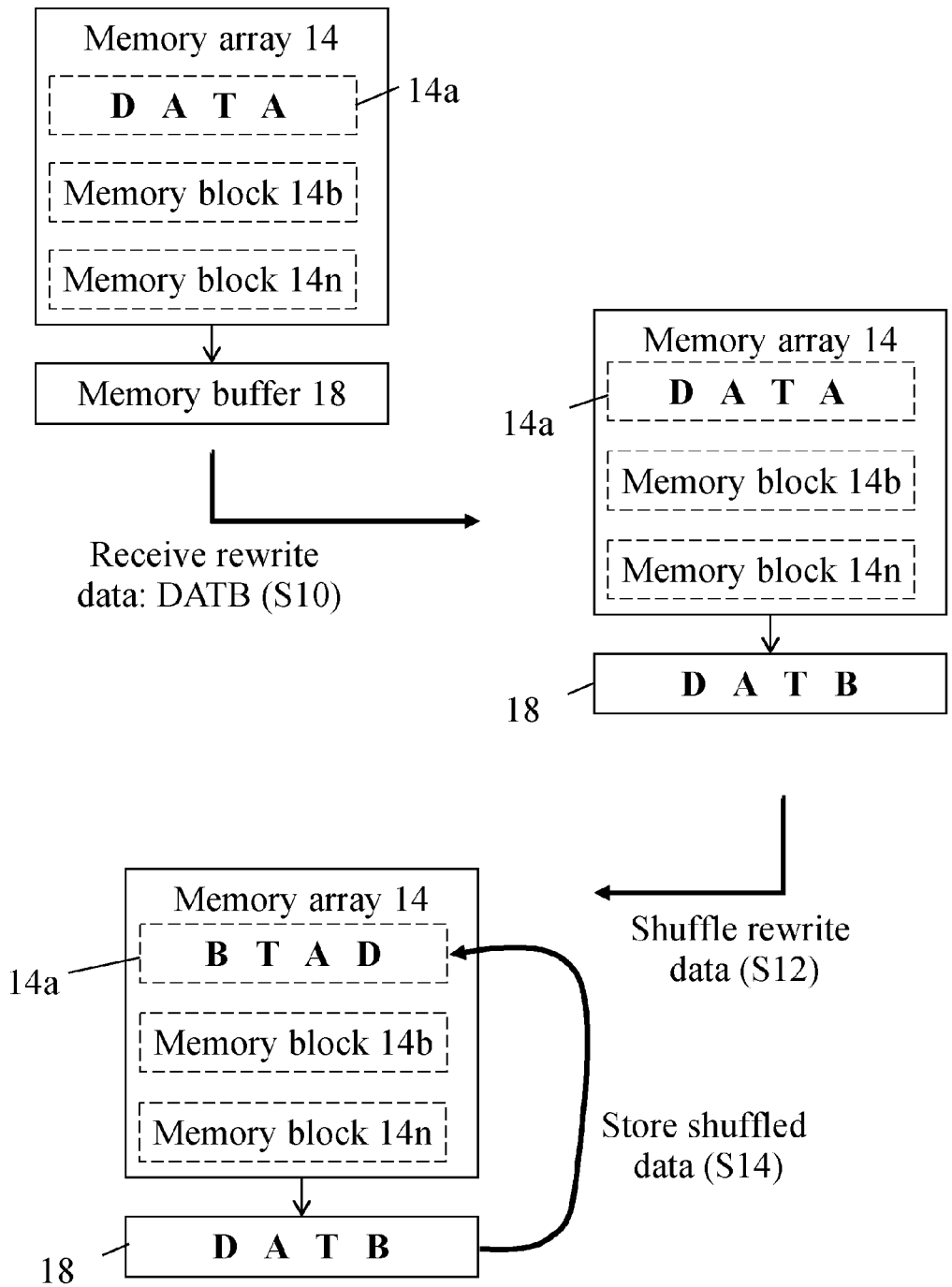
FIG. 2 illustrates an example of memory-block wear-levelling using the apparatus of FIG. 1.

FIG. 2 illustrates an example of memory-block wear-levelling using the apparatus of FIG. 1. The example depicted and described here is merely for illustrative purposes only. In the example, the memory array 14 comprises multiple memory blocks 14a, 14b, . . . , 14n. Memory block 14a contains data, which in this example is a four-byte word "D A T A". (However, it will be understood that the present wear-levelling techniques apply to any size/granularity of data, and is not limited to bits, nibbles, bytes, words, double-words, etc). In a write (program/erase) operation, the data stored in memory block 14a is to be rewritten using a wear-levelling technique. In the illustrated example, the fourth byte of the four-byte word is to be rewritten, i.e. the four-byte word "D A T A" is to be rewritten as "D A T B", where the fourth byte changes from 'A' to 'B' (step S10). In common wear-levelling techniques, the new data would merely be rewritten to a free memory block (e.g. memory block 14b). However, since load imbalance typically occurs at a finer granularity, the same portion of physical memory would be programmed/erased more frequently than other portions of physical memory within the same memory block. The shuffler 16 of the apparatus 10 provides finer-grain wear-levelling. In this example, the first three bytes of the word "D A T A" do not change, whereas the fourth byte changes from 'A' to 'B'. Consequently, the physical locations in the memory array 14 which store the fourth byte may be much more frequently updated (i.e. may be the 'hot' locations) than other locations in the array 14.

In embodiments, to level the wear across the memory array 14, the new write data that is to be stored in memory block 14a (i.e. the block which is being rewritten), is temporarily written to memory (write) buffer 18, as explained above. The shuffler 16 operates on the write data ("D A T B") stored in the memory buffer 18 to shuffle the order of the bytes (step S12). In this example, the order of the bytes is reversed (i.e. to "B T A D"), but any intra-block shuffling scheme may be applied.

In embodiments, the shuffler 16 (second component) is configured to use a configuration function to determine an intra-block mapping scheme, and apply the determined intra-block mapping scheme to the write data to be stored within the memory array to provide the shuffled data.

The configuration function may be used to determine an intra-block mapping scheme from a plurality of pre-defined intra-block mapping schemes. The apparatus 10 may further comprise a data store 22 configured to store the plurality of pre-defined intra-block mapping schemes (e.g. in the intra-block mapping scheme table 26).

The shuffled data provided by shuffler 16 is then written from the memory buffer 18 to memory block 14a (step S14). Thus, FIG. 2 shows how data is shuffled when it is written/rewritten in the memory array 14.

In embodiments, a partial rewrite of the data stored in the first block may be required. In this case, the shuffling process may comprise performing at least a partial rewrite of the data originally stored in the first block by using the configuration function to determine a further intra-block mapping scheme; applying the determined further intra-block mapping scheme to the data originally stored in the first block provide shuffled data; and writing the shuffled data to the first block of physical memory.

Figure 3:
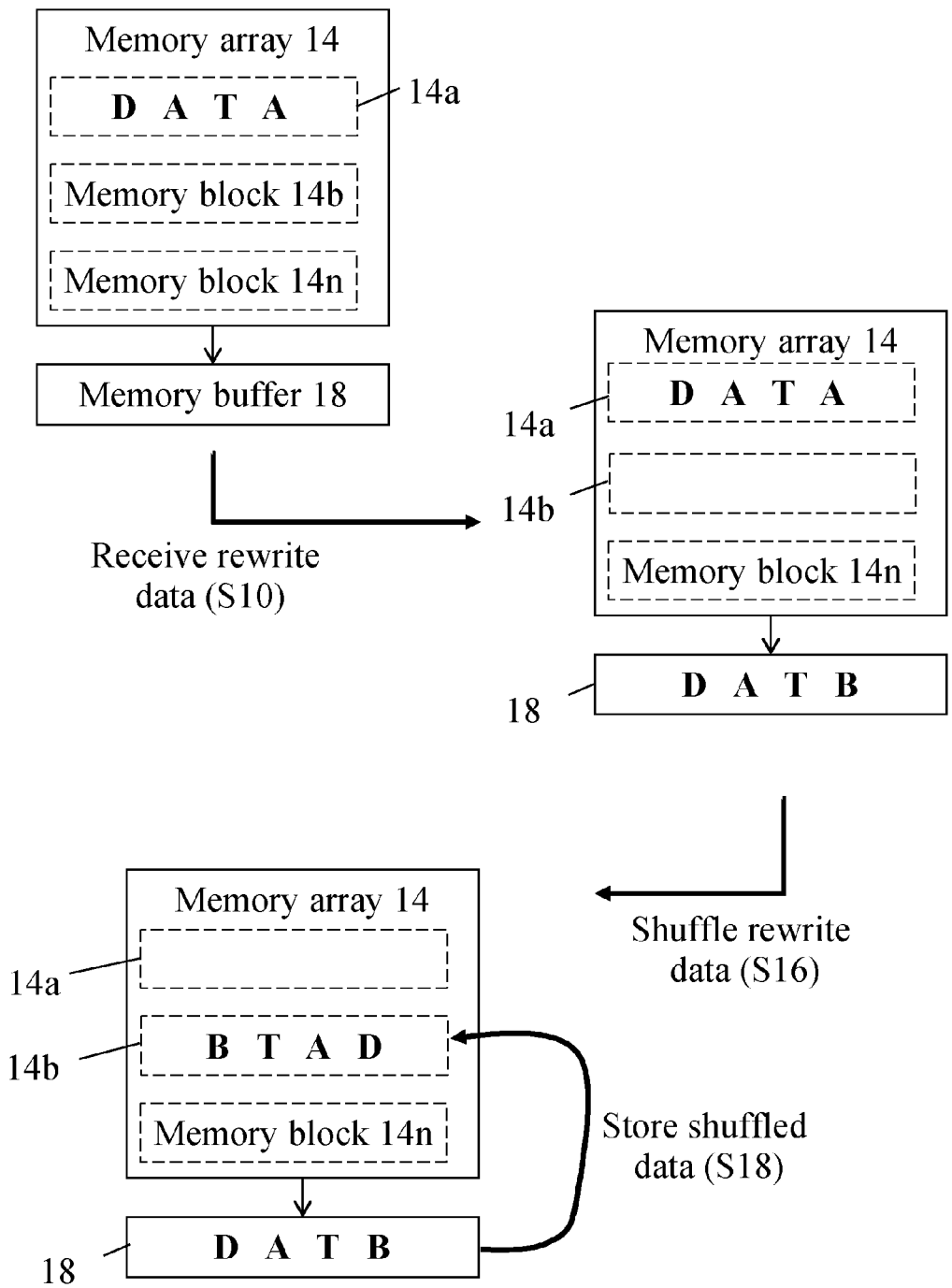
FIG. 3 illustrates a further example of memory-block wear-levelling using the apparatus of FIG. 1.

Turning now to FIG. 3, this illustrates an example of memory-block wear-levelling which combines intra-block shuffling with block remapping. Compared to FIG. 2, in the process illustrated in FIG. 3 the contents of a memory block are written to a new, free memory block as well as being shuffled. The example depicted and described here is merely for illustrative purposes only. In the example, the memory array 14 comprises multiple memory blocks 14a, 14b, 14n. Memory block 14a contains data, which in this example is a four-byte word "D A T A". Memory block 14b is free, i.e. does not contain any data. In a write (program/erase) operation, the data stored in memory block 14a is to be rewritten. In the example, the fourth byte of the four-byte word is to be rewritten, i.e. the four-byte word "D A T A" is to be rewritten as "D A T B", where the fourth byte changes from 'A' to 'B' (step S10). In common wear-levelling techniques, the new data would merely be rewritten to the free memory block 14b, and subsequently erased from memory array 14a. However, since load imbalance typically occurs at a finer granularity, the same portion of physical memory would be programmed/erased more frequently than other portions of physical memory within the same memory block. The shuffler 16 of the apparatus 10 provides finer-grain wear-levelling. In this example, the first three bytes of the word "D A T A" do not change, whereas the fourth byte changes from 'A' to 'B' (step S16). Consequently, the physical locations in the memory array 14 which store the fourth byte may be much more frequently updated than other locations in the array 14.

In embodiments, to level the wear across the memory array 14, the write data that is to be stored in memory array 14, is temporarily written to write buffer 18, as explained above. The shuffler 16 operates on the write data ("D A T B") stored in the write buffer 18 to shuffle the order of the bytes (step S18). In this example, the order of the bytes is reversed (i.e. to "B T A D"), but any intra-block shuffling scheme may be applied.

In the example of FIG. 3, the shuffler 16 (second component) is configured to determine an intra-block shuffling scheme, and apply the intra-block shuffling scheme to the write data to be stored within the memory array to provide the shuffled data. In embodiments, the intra-block memory scheme is stored in a data store 22 configured to store the determined intra-block shuffling scheme.

In the combined shuffling and remapping technique of FIG. 3, the shuffled data provided by shuffler 16 is written to the free memory block 14b (step S14) and the contents of memory block 14a may be erased. Thus, FIG. 3 shows how data is written to new locations in the physical memory and shuffled such that all locations in the physical memory may be programmed/erased substantially the same number of times.

Figure 4:
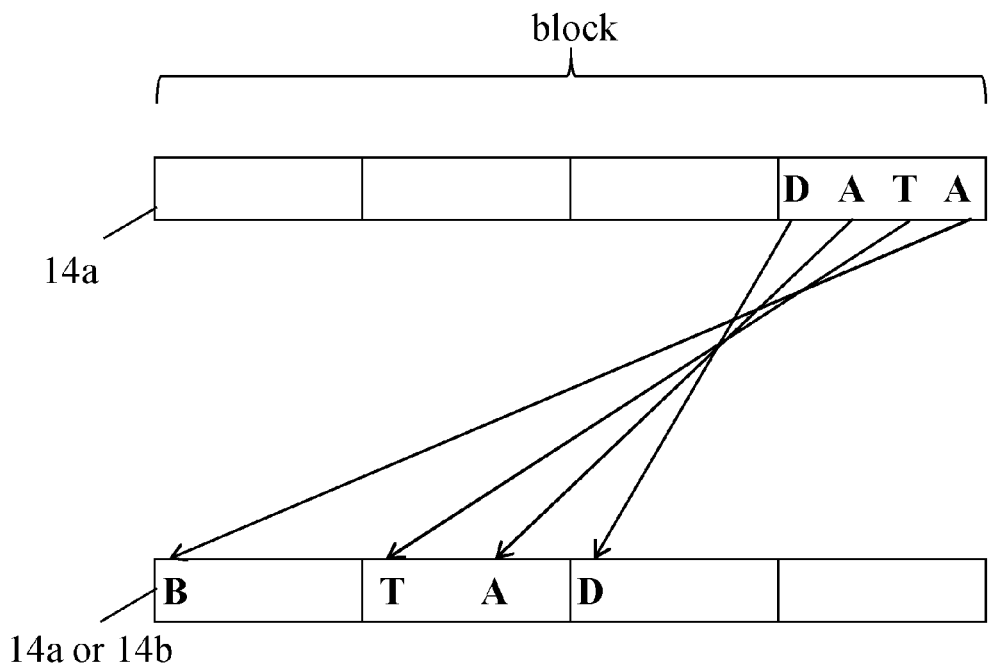
FIG. 4 illustrates schematic diagrams of example intra-memory-block wear-levelling using the apparatus of FIG. 1.

FIG. 4 illustrates examples of intra-block wear-levelling using the apparatus of FIG. 1. The upper diagram shows how a shuffler 16 may operate on data stored in a memory block 14a (in the memory array 14), to shuffle the data when it is written to either the same block 14a or to a free memory block 14b (depending on whether the intra-block shuffling is being combined with block remapping). In the illustrated example, portions of the memory block may not change during the write operation (e.g. the first three portions), but the fourth portion (storing "D A T A") does change (to "D A T B" for example). Common wear-levelling techniques which rewrite whole blocks of data do not take into account that certain portions of the block (e.g. bits or bytes) may be updated more frequently within the block. In embodiments of the present techniques, the shuffler 16 shuffles the more frequently rewritten portion (the fourth portion in this example) such that the rewritten data is shuffled across the block. In the example shown in FIG. 4, the data of the fourth portion in memory block 14a is shuffled and dispersed in memory block 14a or 14b. The write data could be shuffled and stored within the same memory block 14a, if a block remapping scheme is not also applied. The shuffler 16 may shuffle the data by using a configuration function to determine an intra-block shuffling scheme and apply the determined intra-block shuffling scheme.

The lower diagram of FIG. 4 shows a further example of how a shuffler 16 may operate on a memory block using pre-defined intra-block shuffling schemes. Here, the intra-block mapping scheme table 26 stores four different intra-block mapping schemes which may be applied to write data block to shuffle the data before it is written to the memory array. In this example, the numbers 1 to 4 identify the byte position in the memory block. (However, it will be understood that the present wear-levelling techniques apply to any size/granularity of data, and is not limited to bits, nibbles, bytes, words, double-words, etc. Accordingly, the numbers 1 to 4 may identify bit position, byte position, word position, etc). Under intra-block mapping scheme B, the order of the data in the block is reversed, such that data from byte 4 is saved in byte position 1 in a physical memory block, data from byte 3 is saved in byte position 2 in a physical memory block, and so on. Under intra-block mapping scheme C, data from byte 4 is saved in byte position 2 in a physical memory block, data from byte 3 is saved in byte position 1 in a physical memory block, and so on. In this example, the shuffler 16 may sequentially apply the pre-defined intra-block shuffling schemes each time data having a particular logical address is to be rewritten in the physical memory space, starting from scheme B, then scheme C, then scheme D, and ending at scheme A, before repeating the cycle. In this way, all bytes in a data block may be shuffled within the block when a rewrite takes place, such that all locations in a physical may be written to equally frequently. This example of intra-block shuffling shows how if a certain location in a physical memory is a 'hot byte', the overall lifetime of the physical memory may be increased by avoiding simply writing new data to the 'hot byte'. It will be appreciated that the schemes shown in the table are merely for illustrative purposes and the number of pre-defined intra-block mapping schemes may be more or less than those shown here, and may reorder the data in different ways to those shown here, and may apply to any granularity of data (e.g. bits, nibbles, bytes, words, double-words, etc).

In embodiments, the apparatus 10 may keep a track of which of the pre-defined intra-block mapping schemes has been applied to data associated with each logical address, such that the shuffler 16 knows which pre-defined intra-block mapping scheme it needs to apply the next time that data is being shuffled (and optionally remapped in physical memory space) during a write operation, and/or such that the shuffler 16 knows which scheme had been applied when it needs to unshuffle data during a read operation. For example, the shuffler 16 may be configured to store indication data in the address mapping table 24 or in the mapping scheme table 26, or elsewhere, indicating which pre-defined intra-block mapping scheme has been applied to the data associated with a logical address. Alternatively, the configuration function may be used to determine and redetermine which of the pre-defined intra-block mapping schemes to use, based on the logical and/or physical address of the write data. In this embodiment, no indication data need be stored, as the configuration function determines and applies the intra-block mapping scheme using address data that is already known/stored.

In order to read data that has been shuffled, the stored shuffled data may need to be unshuffled (ordered). Thus, the shuffler 16 and/or the wear-leveller 12 may know, or may be able to determine, which intra-block shuffling scheme was applied to the data. In an embodiment, an indication or indication data indicating which intra-block shuffling scheme has been applied to the data may be stored so that it can be readily identified by the shuffler 16/wear-leveller 12. The indication data may be stored in, for example, the address mapping table 24 (where a few bits could be reserved for this purpose for each table entry), or in a dedicated intra-block mapping scheme table 26. However, this may result in increased overheads. Thus, in a preferred embodiment, the shuffler 16 may be configured to use the configuration function to determine an intra-block shuffling scheme, where the configuration function is dependent on the logical address and/or the physical address of the write data (which may be a new physical address or the original physical address). In this case, the address mapping table 24 would provide the data required to re-determine the intra-block shuffling scheme applied to a particular block of data in the memory array 14. Using both the logical address and the physical address may provide increased entropy than if the configuration function depended on only one of the logical or physical address.

Figure 5:
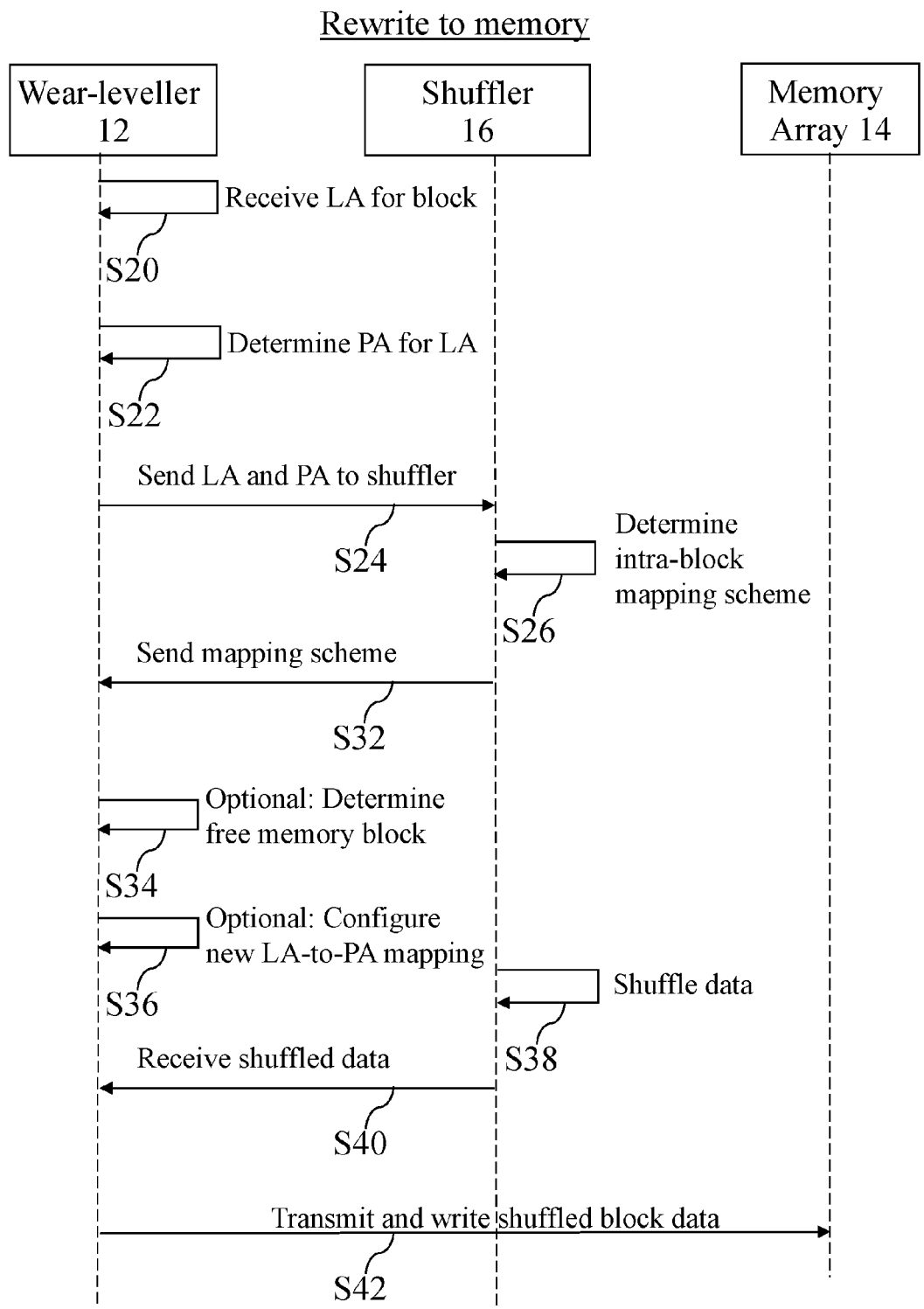
FIG. 5 shows a schematic diagram of the steps to rewrite a block in a memory of the wear-levelling apparatus of FIG. 1.

FIG. 5 shows a schematic diagram to rewrite a memory block in the physical memory array 14 of the wear-levelling apparatus of FIG. 1. In embodiments, the method of writing/rewriting a block in a physical memory array while also performing wear-levelling may comprise determining a first physical memory address of a first block of physical memory, the first block of physical memory storing data from a (previous) write operation; shuffling write data to be stored within the memory array to provide shuffled data; and writing the shuffled data to the first block of physical memory.

The wear-leveller 12 may receive a signal/data indicating a memory block of the physical memory array 14 is to be rewritten (step S20). The signal includes the logical address (LA) of the block. The wear-leveller 12 determines the physical address (PA) that corresponds to the received logical address (LA) (step S22). As explained earlier, the wear-leveller 12 may look-up a map from the logical address to the physical address that is stored in, for example, an address mapping table 24.

In an embodiment, once the physical address has been obtained, the wear-leveller 12 sends the logical address and the physical address to the shuffler 16 (step S24). The shuffler 16 uses a configuration function to determine an intra-block mapping scheme that is to be applied to the memory block (step S26). As explained earlier, the shuffler 16 may use the configuration function to determine the intra-block mapping scheme by selecting a scheme from a plurality of pre-defined, stored intra-block mapping scheme. In embodiments, the configuration function may use the logical address (or the logical and physical memory address) as an input and determine the intra-block mapping scheme. Additionally or alternatively, the shuffler 16 may determine the intra-block mapping scheme by inputting the physical memory address of a free memory block (where the write data is to be written) and the logical address of the block into a configuration function. Accordingly, in embodiments, steps S34 and S36 may be performed before steps S24, S26 and S32 in FIG. 5, so that the shuffler 16 has the new physical memory address (of the free memory block) when it is determining the intra-block mapping scheme.

In embodiments, the method of shuffling the data comprises using a configuration function to determine an intra-block mapping scheme, and applying the determined intra-block mapping scheme to the write data to be stored within the memory array to provide the shuffled data. The method of using a configuration function may comprise using the configuration function to determine an intra-block mapping scheme from a plurality of pre-defined intra-block mapping schemes. Determining the intra-block shuffling scheme may comprise using the shuffler 16 to input the logical address of the write data into the configuration function to determine the intra-block mapping scheme. Alternatively, determining the intra-block shuffling scheme may comprise inputting a logical address of the write data and a physical memory address into the configuration function to determine the intra-block mapping scheme. (e.g. the first or second memory block physical address, depending on whether block remapping is being combined with intra-block shuffling) In embodiments, the configuration function may be a hash function.

Optionally, once the shuffler 16 has determined the intra-block mapping scheme, it may send the mapping scheme to the wear-leveller 12 (step S32). This may occur if, for example, the wear-leveller is configured to store an indication of which mapping scheme has been used in a data store (e.g. in an address mapping table 24 or intra-block mapping scheme table 26) for later use. Alternatively, the shuffler 16 may be configured to store the indication of which mapping scheme has been used itself, such that transmittal to the wear-leveller 12 is not required.

In embodiments, the write/rewrite process further comprises determining the intra-block mapping scheme from a table storing the plurality of pre-defined intra-block mapping schemes.

In embodiments, the write/rewrite process comprises determining the intra-block mapping scheme from a table storing the plurality of pre-defined intra-block mapping schemes; and storing data in the table indicating the determined pre-defined intra-block mapping scheme.

As will be described in more detail below with reference to FIG. 6, storing an indication of which intra-block mapping scheme has been applied to data stored in a memory block may enable shuffled data to be read (ordered) during a read operation. In embodiments, reading the shuffled data from the physical memory comprises re-determining the intra-block mapping scheme applied to provide shuffled data, and using the re-determined intra-block mapping scheme to reverse the shuffling method to obtain the data originally stored in the first block. However, an indication of which intra-block mapping scheme has been applied need not be stored if the configuration function uses the LA (or LA and PA) of write data to determine the intra-block mapping scheme, as explained earlier.

In embodiments, the method of shuffling the data may comprise shuffling data bits or data bytes to be stored within the memory array.

Optionally, the wear-leveller 12 is further configured to determine which blocks in the memory array 14 are free (i.e. not being used to store data). If there are multiple free memory blocks, the wear-leveller 12 may be configured to select a free memory block. The wear-leveller 12 then determines/selects a free memory block which is to be used to store the rewrite data (step S34). The wear-leveller 12 configures a new logical address to physical address mapping, such that the next time it receives the logical address, the logical address will be mapped to the new memory block (step S36). In embodiments, the wear-leveller 12 updates the address mapping table 24 to store the new LA to PA mapping. As mentioned above, the methods to determine the new LA to PA mapping may be performed before the shuffler determines the intra-block mapping scheme, particularly in those embodiments where the address of the write data is used by the configuration function to determine the intra-block mapping scheme.

The shuffler 16 is configured to shuffle the data that is being written/rewritten using the determined intra-block mapping scheme (step S38). The shuffler 16 may be operating on data that has been temporarily stored/written to a write buffer 18, as discussed earlier. In embodiments therefore, the write/rewrite process may further comprise writing the write data to be stored within the physical memory array to a write buffer, shuffling the data in the write buffer to provide shuffled data, and writing the shuffled data from the write buffer to a block of physical memory (either the first block, or a second free block, depending on whether the optional block remapping technique is used in addition to intra-block shuffling). In embodiments, the shuffled data is sent from the shuffler 16 to the wear-leveller 12 (step S40), which is configured to transmit and write the shuffled block data to the new physical address in the memory array 14 (step S42). In other embodiments, the shuffler 16 may be configured to transmit the shuffled data to another component of the apparatus 10, or may be configured to write the shuffled block data to the new physical memory address itself. In embodiments, the process may further comprise clearing/erasing the first block of physical memory after the shuffled data has been written to the second block of physical memory.

Figure 6:
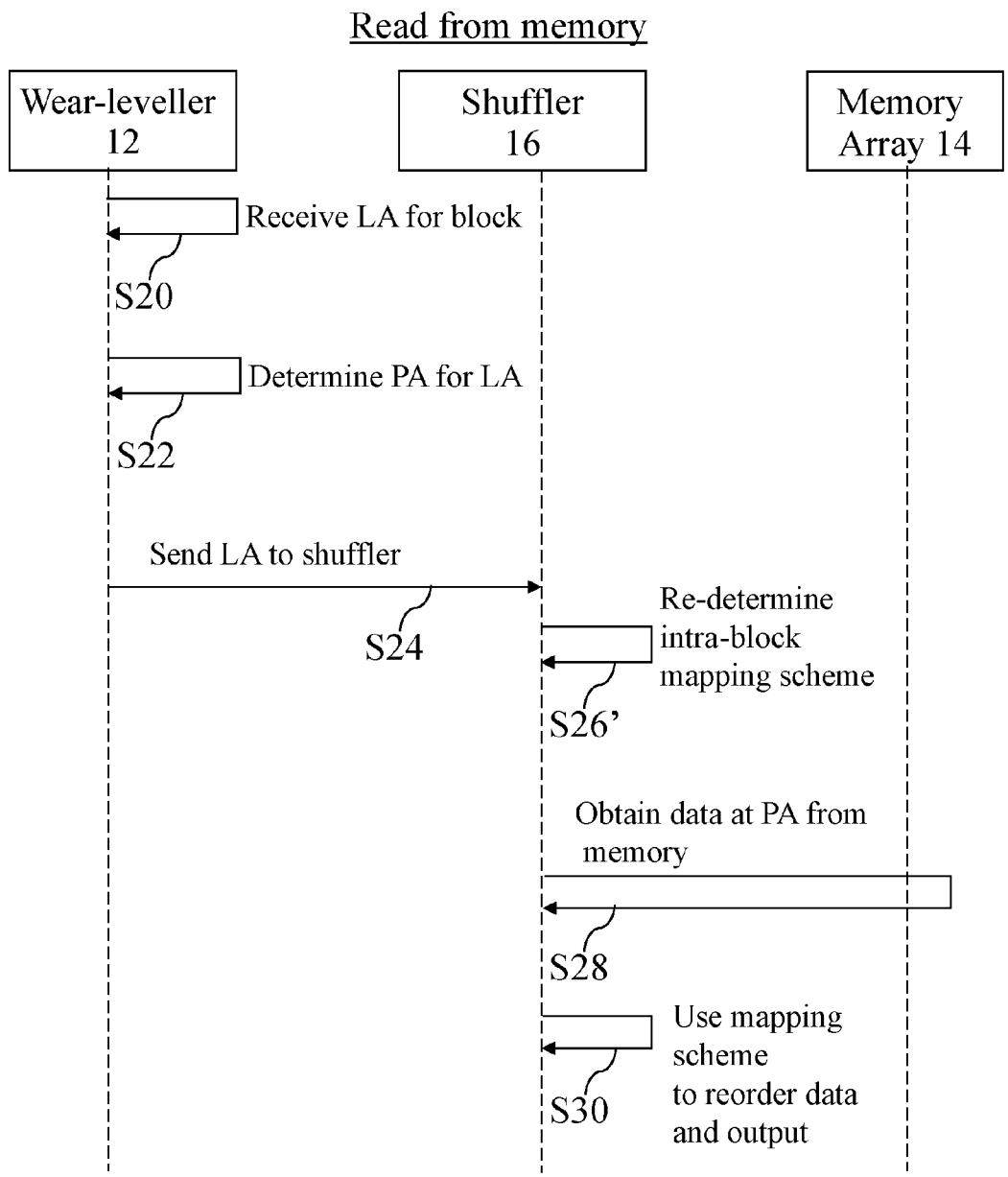
FIG. 6 shows a schematic diagram of the steps to read a block from a memory of the wear-levelling apparatus of FIG. 1.

FIG. 6 shows a schematic diagram of the method to read a block from a memory array of the wear-levelling apparatus of FIG. 1. The wear-leveller 12 may receive a signal/data indicating a block of the physical memory array 14 is to be read (step S20). The signal includes the logical address (LA) of the data in the block. The wear-leveller 12 determines the physical address (PA) that corresponds to the received logical address (LA) (step S22). As explained earlier, the wear-leveller 12 may look-up a map from the logical address to the physical address that is stored in, for example, an address mapping table 24.

In an embodiment, once the physical address has been obtained, the wear-leveller 12 may send the logical address (or the logical address and the physical address) to the shuffler 16 (step S24). The shuffler 16 uses the configuration function to re-determine the intra-block mapping scheme that had been applied to the data in the memory block when it was stored (step S26'). For example, the shuffler 16 may use the configuration function to re-determine the intra-block mapping scheme by inputting the logical memory address of the memory block (i.e. what is being read) into the configuration function, or by inputting the physical memory address of a memory block (i.e. what is being read) and the logical address of the block into the configuration function. If the configuration function does not use the address of the data to determine an intra-block shuffling scheme, the shuffler 16 may be configured to look-up which of the pre-defined intra-block mapping schemes was applied by, for example, consulting stored data that keeps track of the schemes (e.g. by storing indication data in an address mapping table 24 or intra-block mapping scheme table 26). Additionally or alternatively, The shuffler 16 may then obtain the data at the physical memory address from memory array 14 (step S28), either directly itself, or via another component or components of the apparatus 10. The shuffler operates on the data in the memory block by applying, for example, an inverse of the function used to shuffle the data, to produce reordered, unshuffled (ordered) data (step S30). The unshuffled (ordered) data is then output in response to the read operation.

Turning back to FIG. 1, as mentioned above the memory array 14 of the wear-levelling apparatus 10 may comprise a correlated electron switch (CES) element. In this context, a CES element may exhibit an abrupt conductor/insulator transition from a conductive state (a low impedance and low capacitance state) to an insulative (high impedance and high capacitance state) state, or vice versa, arising from electron correlations in the CEM rather than solid state structural phase changes (e.g., crystalline/amorphous changes as occurs in phase change memory (PCM) devices or filamentary formation as occurs in resistive RAM devices).

In embodiments, the abrupt conductor/insulator transition in a CEM may be responsive to a quantum mechanical phenomenon, in contrast to melting/solidification or filament formation. Such a quantum mechanical transition between conductive and insulative states in a CES element may be understood in any one of several aspects.

In embodiments, the quantum mechanical transitions between an insulative and conductive states may be understood in terms of Mott transitions. For example, a CEM may switch from an insulative state to a conductive state if a first Mott transition condition is met and may switch from a conductive state to insulative state if a second Mott transition condition is met. The different Mott transition conditions will be described in further detail below.

In particular implementations of embodiments of the present techniques, a memory circuit may comprise: a memory array including at least one CES element; a write circuit for placing the CES element in a first memory state or a second memory state depending on signals provided to the memory array (or to a memory block within the memory array), wherein an impedance of the CES element is higher in the second memory state than in the first memory state; and a read circuit for sensing the memory state of the memory array (or block) and providing an electrical signal corresponding to the sensed memory state of the memory array (or block).

In one aspect, the impedance of the CES element in the second impedance state may be more than 100 times greater than the impedance of the CES element in the first impedance state.

The CES element may function as a CES random access memory (CeRAM). The CES element comprises a material that may transition between or among a plurality of predetermined detectable memory states based, at least in part, on at least a portion of the CEM transitioning between memory states (e.g. from an insulative to a conductive state) utilizing, for example, a Mott transition. In this context, a "memory state" means a detectable state of the CES element that is indicative of a value, symbol, parameter or condition, just to provide a few examples.

In one particular implementation, a memory state of the CES element may be detected based, at least in part, on the value of a signal detected on one or more the terminals of the CES element in a "read operation".

In another particular implementation, the CES element may be placed in a particular memory state to represent or store a particular value, symbol, parameter or condition etc. by controlling the bias parameters (e.g. voltage) applied to the CES element and/or by controlling the current parameters (e.g. current density $J(A/\mu m^2)$ driven through the CES element.

In an embodiment, the CEM comprises a switching region (S) arranged in electrical contact with (e.g. sandwiched between) conductive regions (C), in a (C/S/C) arrangement on a semiconductor (e.g. in a stack arrangement). The conductive region (C) may comprise any suitable material, and may comprise a transition metal oxide, and may further include any material comprising metal-like characteristics, including, for example, polysilicon or a doped semiconductor. In embodiments, the conductive region (C) may additionally or alternatively comprise a material selected from a group comprising aluminium, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

According to an embodiment, the switching region (S) may comprise any transition metal oxide (TMO) material, such as, for example, perovskites, Mott insulators, charge exchange insulators, and Anderson disorder insulators.

In particular implementations, the switching region (S) material may include switching materials such as nickel oxide, cobalt oxide, iron oxide, yttrium oxide, and perovskites such as Cr doped strontium titanate, lanthanum titanate, and the manganate family including praesydium calcium, manganate, and praesydium lanthanum manganite, just to provide a few examples. In particular, oxides incorporating elements with incomplete d and f orbital shells may exhibit sufficient resistive switching properties for use as a switching region (S) material. In an embodiment, the CES element may be prepared without electroforming.

Other implementations may employ other transition metal compounds as the switching region (S) material without deviating from claimed subject matter. For example, $\{M(chxn)_2Br\}Br_2$ where M may comprise Pt, Pd, or Ni, and chxn comprises 1R, 2R-cyclohexanediamine, and other such metal complexes may be used without deviating from claimed subject matter.

In one aspect, the CEM may comprise materials that are transition metal oxide (TMO) variable resistance materials, though it should be understood that these are exemplary only, and are not intended to limit claimed subject matter. Particular implementations may employ other variable resistance materials as well. Whilst nickel oxide, NiO, is disclosed as one particular TMO above, NiO materials may also be doped with extrinsic ligands, which may stabilize variable resistance properties. In particular, NiO variable resistance materials disclosed herein may include a carbon containing ligand, which may be indicated by NiO(Cx). Here, one skilled in the art may determine a value of x for any specific carbon containing ligand and any specific combination of carbon containing ligand with NiO simply by balancing valences. In another particular example, NiO doped with extrinsic ligands may be expressed as NiO(Lx), where Lx is a ligand element or compound and x indicates a number of units of the ligand for one unit of NiO. One skilled in the art may determine a value of x for any specific ligand and any specific combination of ligand with NiO or any other transition metal simply by balancing valences.

Furthermore, the terminals may comprise the same materials as the conductive regions (C), such that the conductive regions (C) may function as the terminals. In embodiments where the material for the terminals and the conductive regions (C) are not the same, it is preferable that the different materials are matched to reduce the effects of border interactions or surface defects which may otherwise affect performance of the CES element. For example, the materials should be matched to ensure the electrical properties (e.g. conductivities) and/or chemical properties (e.g. coefficients of thermal expansion match) of the CEM and terminals do not negatively impact the operation of the CES element.

By applying a specific voltage ($V_{applied}$) between the terminals and driving a specific current density ($J_{applied}$) through the CEM, the CES element may transition from a conductive (low impedance and low capacitance) memory state, hereinafter "LIS", to an insulative (high impedance and high capacitance) memory state, hereinafter "HIS", or may transition from a HIS to an LIS in accordance with a different applied voltage ($V_{applied}$) and current density ($J_{applied}$).

In this context, it should be understood that LIS and HIS are relative terms and not specific to any particular quantity or value for conductance, impedance, or capacitance. For example, whilst in a first memory state the CES element may be more conductive (or less insulative), than while the CES element is in a second memory state.

Furthermore CES elements are "born on", whereby when fabricated (e.g. deposited), the CES element is in a LIS.

Embodiments of the present techniques also provide a non-transitory data carrier carrying code which, when implemented on a processor, causes the processor to carry out the methods described herein.

The techniques further provide processor control code to implement the above-described methods, for example on a general purpose computer system or on a digital signal processor (DSP). The techniques also provide a carrier carrying processor control code to, when running, implement any of the above methods, in particular on a non-transitory data carrier or on a non-transitory computer-readable medium such as a disk, microprocessor, CD- or DVD-ROM, programmed memory such as read-only memory (firmware), or on a data carrier such as an optical or electrical signal carrier. The code may be provided on a (non-transitory) carrier such as a disk, a microprocessor, CD- or DVD-ROM, programmed memory such as non-volatile memory (e.g. Flash) or read-only memory (firmware). Code (and/or data) to implement embodiments of the techniques may comprise source, object or executable code in a conventional programming language (interpreted or compiled) such as C, or assembly code, code for setting up or controlling an ASIC (Application Specific Integrated Circuit) or FPGA (Field Programmable Gate Array), or code for a hardware description language such as Verilog™ or VHDL (Very high speed integrated circuit Hardware Description Language). As the skilled person will appreciate, such code and/or data may be distributed between a plurality of coupled components in communication with one another. The techniques may comprise a controller which includes a microprocessor, working memory and program memory coupled to one or more of the components of the system.

Computer program code for carrying out operations for the above-described techniques may be written in any combination of one or more programming languages, including object oriented programming languages and conventional procedural programming languages. Code components may be embodied as procedures, methods or the like, and may comprise sub-components which may take the form of instructions or sequences of instructions at any of the levels of abstraction, from the direct machine instructions of a native instruction set to high-level compiled or interpreted language constructs.

It will also be clear to one of skill in the art that all or part of a logical method according to the preferred embodiments of the present techniques may suitably be embodied in a logic apparatus comprising logic elements to perform the above-described methods, and that such logic elements may comprise components such as logic gates in, for example a programmable logic array or application-specific integrated circuit. Such a logic arrangement may further be embodied in enabling elements for temporarily or permanently establishing logic structures in such an array or circuit using, for example, a virtual hardware descriptor language, which may be stored and transmitted using fixed or transmittable carrier media.

In an embodiment, the present techniques may be realised in the form of a data carrier having functional data thereon, said functional data comprising functional computer data structures to, when loaded into a computer system or network and operated upon thereby, enable said computer system to perform the above-described method.

Accordingly, some aspects and features of the disclosed embodiments are set out in the following numbered items:

1. A method of wear-levelling a memory array, the method comprising: determining a first physical memory address of a first block of physical memory, the first block of physical memory configured to store data from a write operation; shuffling write data to be stored within the memory array to provide shuffled data; and writing the shuffled data to the first block of physical memory.

2. The method as described in item 1 wherein the step of shuffling the write data comprises: using a configuration function to determine an intra-block mapping scheme; and applying the determined intra-block mapping scheme to the write data to be stored within the memory array to provide the shuffled data.

3. The method as described in item 2 wherein the step of using a configuration function comprises using the configuration function to determine an intra-block mapping scheme from a plurality of pre-defined intra-block mapping schemes.

4. The method as described in item 3 further comprising inputting a logical address of the write data into the configuration function to determine the intra-block mapping scheme.

5. The method as described in item 3 further comprising inputting a logical address of the write data and the first physical memory address into the configuration function to determine the intra-block mapping scheme.

6. The method as described in item 4 or 5 further comprising determining the intra-block mapping scheme from a table storing the plurality of pre-defined intra-block mapping schemes.

7. The method as described in item 3 further comprising: determining the intra-block mapping scheme from a table storing the plurality of pre-defined intra-block mapping schemes; and storing data in the table indicating the determined pre-defined intra-block mapping scheme.

8. The method as described in any one of items 2 to 7 further comprising reading the shuffled data from the first block of physical memory by using the configuration function to re-determine the intra-block mapping scheme applied to provide shuffled data, and using the re-determined intra-block mapping scheme to reverse the shuffling step to obtain the data originally stored in the first block.

9. The method as described in item 8 further comprising performing at least a partial rewrite of the data originally stored in the first block by: using the configuration function to determine a further intra-block mapping scheme; applying the determined further intra-block mapping scheme to the data originally stored in the first block provide shuffled data; and writing the shuffled data to the first block of physical memory.

10. The method as described in any preceding item further comprising: identifying a physical memory address of a second, free block of physical memory; assigning the second physical memory address to the shuffled data; and writing the shuffled data to the second block of physical memory.

11. The method as described in item 10 when dependent on item 3 further comprising inputting a logical address of the write data and the second physical memory address into the configuration function to determine the intra-block mapping scheme.

12. The method as described in any one of items 2 to 11 wherein the configuration function is a hash function.

13. The method as described in any preceding item wherein the step of determining the first physical memory address comprises: receiving a logical memory address; looking-up the received logical memory address in an address mapping table; and determining the first physical memory address that corresponds to the logical memory address from the address mapping table.

14. The method as described in item 13 when dependent on item 7 wherein the step of storing data indicating the determined pre-defined intra-block mapping scheme comprises storing the data in the address mapping table in association with the logical memory address.

15. The method as described in any preceding item wherein the step of shuffling the write data comprises shuffling data bits or data bytes to be stored within the memory array.

16. The method as described in any preceding item wherein determining a first physical memory address of a first block of physical memory comprises determining a first physical memory address in a non-volatile memory.

17. The method as described in any preceding item wherein determining a first physical memory address of a first block of physical memory comprises determining a first physical memory address in any one or more of: a flash memory, a phase change memory, a resistive random access memory, or a Correlated Electron Material memory.

18. The method as described in any preceding item further comprising writing the write data to be stored within the memory array to a write buffer, shuffling the write data in the write buffer to provide shuffled data, and writing the shuffled data from the write buffer to any one of the first or second block of physical memory.

19. The method as described in any preceding item wherein the memory array is a non-volatile memory array.

20. An apparatus for wear-levelling a memory array, the apparatus comprising: a physical memory array; a first component configured to: determine a first physical memory address of a first block of physical memory, the first block of physical memory storing data from a write operation; a second component configured to: shuffle write data to be stored within the memory array to provide shuffled data; and a third component configured to: write the shuffled data to the first block of physical memory.

21. The apparatus as described in item 20 wherein the second component is further configured to: use a configuration function to determine an intra-block mapping scheme, and apply the determined intra-block mapping scheme to the write data to be stored within the memory array to provide the shuffled data.

22. The apparatus as described in item 21 wherein the configuration function is used to determine an intra-block mapping scheme from a plurality of pre-defined intra-block mapping schemes, and the apparatus further comprises a data store configured to store the plurality of pre-defined intra-block mapping schemes.

23. The apparatus as described in item 22 wherein the data store comprises a page table configured to store the first physical memory address, a logical address of the write data, and the plurality of pre-defined intra-block mapping schemes.

24. The apparatus as described in item 23 wherein the page table is further configured to store data indicating the determined intra-block mapping scheme in association with at least the logical address of the write data.

25. The apparatus as described in any one of items 20 to 24 wherein the first component is further configured to: identify a second physical memory address of a second, free block of physical memory; and assign the second physical memory address to the shuffled data.

26. The apparatus as described in any one of items 20 to 25 wherein the data store further comprises an address mapping table, wherein the first component is further configured to: receive a logical memory address for the write data; look-up the received logical memory address in the address mapping table; and determine the first physical memory address that corresponds to the logical memory address from the address mapping table.

27. The apparatus as described in any one of items 20 to 26 further comprising a multiplexer coupled to the physical memory array and the second component, and configured to select data bits or bytes from the physical memory array.

28. The apparatus as described in any one of items 20 to 27 wherein the second component is configured to shuffle data bits or data bytes to be stored within the memory array.

29. The apparatus as described in any one of items 20 to 28 further comprising a write buffer, wherein: the first component is configured to write the write data to be stored within the memory array to the write buffer, the second component is configured to shuffle the write data in the write buffer to provide shuffled data, and the third component is configured to write the shuffled data from the write buffer to the memory array.

30. The apparatus as described in any one of items 20 to 29 wherein the physical memory array comprises a non-volatile memory array.

31. The apparatus as described in any one of items 20 to 30 wherein the physical memory array comprises any one of: flash memory, phase change memory, resistive random access memory, and Correlated Electron Material memory.

32. The apparatus as described in any one of items 20 to 31, wherein the memory array is a non-volatile memory array.

33. A non-transitory data carrier carrying code which, when implemented on a processor, causes the processor to carry out the method of any one of items 1 to 19.

Those skilled in the art will appreciate that while the foregoing has described what is considered to be the best mode and where appropriate other modes of performing present techniques, the present techniques should not be limited to the specific configurations and methods disclosed in this description of the preferred embodiment. Those skilled in the art will recognise that present techniques have a broad range of applications, and that the embodiments may take a wide range of modifications without departing from the any inventive concept as defined in the appended claims.

The invention claimed is:

1. A method of wear-levelling a memory array, the method comprising:
   determining a first physical memory address of a first block of physical memory, the first block of physical memory configured to store write data from a write operation;
   shuffling the write data to be stored within the memory array to provide shuffled data, including:
      using a configuration function to determine an intra-block mapping scheme, where the configuration function is a hash function; and
      applying the determined intra-block mapping scheme to the write data to be stored within the memory array to provide the shuffled data;
   writing the shuffled data to the first block of physical memory.

2. The method as claimed in claim 1 where said using the configuration function comprises using the configuration function to determine the intra-block mapping scheme from a plurality of pre-defined intra-block mapping schemes.

3. The method as claimed in claim 2 further comprising:
   inputting a logical address of the write data into the configuration function to determine the intra-block mapping scheme; or
   inputting the logical address of the write data and the first physical memory address into the configuration function to determine the intra-block mapping scheme.

4. The method as claimed in claim 3 further comprising determining the intra-block mapping scheme from a table storing the plurality of pre-defined intra-block mapping schemes.

5. The method as claimed in claim 2 further comprising:
   determining the intra-block mapping scheme from a table storing the plurality of pre-defined intra-block mapping schemes; and
   storing data in the table indicating the determined pre-defined intra-block mapping scheme.

6. The method as claimed in claim 1 further comprising reading the shuffled data from the first block of physical memory by using the configuration function to re-determine the intra-block mapping scheme applied to provide shuffled data, and using the re-determined intra-block mapping scheme to reverse said shuffling to obtain the data originally stored in the first block.

7. The method as claimed in claim 6 further comprising performing at least a partial rewrite of the data originally stored in the first block by:
   using the configuration function to determine a further intra-block mapping scheme;
   applying the determined further intra-block mapping scheme to the data originally stored in the first block to provide shuffled data; and
   writing the shuffled data to the first block of physical memory.

8. The method as claimed in claim 1 further comprising:
   identifying a second physical memory address of a second, free block of physical memory;
   assigning the second physical memory address to the shuffled data; and
   writing the shuffled data to the second block of physical memory.

9. The method as claimed in claim 1 where said determining the first physical memory address comprises:
   receiving a logical memory address;
   looking-up the received logical memory address in an address mapping table; and
   determining the first physical memory address that corresponds to the logical memory address from the address mapping table.

10. The method as claimed in claim 1, where said shuffling the write data comprises shuffling a bit order or a byte order of the write data to be stored within the memory array.

11. The method as claimed in claim 1 where determining a first physical memory address of a first block of physical memory comprises determining a first physical memory address in a non-volatile memory.

12. The method as claimed in claim 1 further comprising writing the write data to be stored within the memory array to a write buffer, shuffling the write data in the write buffer to provide shuffled data, and writing the shuffled data from the write buffer to any one of the first block of physical memory or a second block of physical memory.

13. An apparatus for wear-levelling a memory array, the apparatus comprising:
   a physical memory array;
   a first component configured to determine a first physical memory address of a first block of physical memory, the first block of physical memory storing write data from a write operation;
   a second component configured to shuffle the write data to be stored within the memory array to provide shuffled data, including:
      use a configuration function to determine an intra-block mapping scheme, where the configuration function is a hash function, and
      apply the determined intra-block mapping scheme to the write data to be stored within the memory array to provide the shuffled data; and
   a third component configured to write the shuffled data to the first block of physical memory.

14. The apparatus as claimed in claim 13 where the configuration function is used to determine an intra-block mapping scheme from a plurality of pre-defined intra-block mapping schemes, and the apparatus further comprises a data store configured to store the plurality of pre-defined intra-block mapping schemes.

15. The apparatus as claimed in claim 14 where the data store comprises a page table configured to store the first physical memory address, a logical address of the write data, and the plurality of pre-defined intra-block mapping schemes.

16. The apparatus as claimed in claim 15 where the page table is further configured to store data indicating the determined intra-block mapping scheme in association with at least the logical address of the write data.

17. The apparatus as claimed in claim 13, where said shuffling the write data includes shuffling a bit order or a byte order of the write data to be stored within the memory array.

18. A non-transitory data carrier carrying code which, when implemented on a processor, causes the processor to carry out a method of any one of wear-levelling a memory array, the method comprising:
- determining a first physical memory address of a first block of physical memory, the first block of physical memory configured to store write data from a write operation;
- shuffling the write data to be stored within the memory array to provide shuffled data including:
  - using a configuration function to determine an intra-block mapping scheme, where the configuration function is a hash function, and
  - applying the intra-block mapping scheme to the write data to be stored within the memory array to provide the shuffled data; and
- writing the shuffled data to the first block of physical memory.

19. The non-transitory data carrier as claimed in claim 18, where said shuffling the write data includes shuffling a bit order or a byte order of the write data to be stored within the memory array.

* * * * *